US012648125B2

(12) United States Patent
Liaw

(10) Patent No.: US 12,648,125 B2
(45) Date of Patent: Jun. 2, 2026

(54) TWO-PORT SRAM CELL STRUCTURE

(71) Applicant: Taiwan Semiconductor Manufacturing Co., Ltd., Hsinchu (TW)

(72) Inventor: Jhon Jhy Liaw, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 311 days.

(21) Appl. No.: 18/446,659

(22) Filed: Aug. 9, 2023

(65) Prior Publication Data

US 2024/0357790 A1 Oct. 24, 2024

Related U.S. Application Data

(60) Provisional application No. 63/497,767, filed on Apr. 24, 2023.

(51) Int. Cl.
H10B 10/00 (2023.01)

(52) U.S. Cl.
CPC .................................. H10B 10/125 (2023.02)

(58) Field of Classification Search
None
See application file for complete search history.

(56) References Cited

U.S. PATENT DOCUMENTS

| | | | |
|---|---|---|---|
| 7,233,032 B2 | 6/2007 | Liaw |
| 8,144,540 B2 | 3/2012 | Liaw |
| 8,625,334 B2 | 1/2014 | Liaw |
| 9,024,392 B2 | 5/2015 | Liaw |
| 9,613,953 B2 | 4/2017 | Liaw |
| 9,640,540 B1 | 5/2017 | Liaw |
| 9,672,903 B2 | 6/2017 | Liaw |
| 9,793,273 B2 | 10/2017 | Liaw |
| 9,805,985 B2 | 10/2017 | Liaw |
| 9,831,253 B2 | 11/2017 | Liaw |
| 9,892,781 B2 | 2/2018 | Liaw |

(Continued)

FOREIGN PATENT DOCUMENTS

| | | |
|---|---|---|
| DE | 102012108290 A1 | 11/2013 |
| KR | 20130069301 A | 6/2013 |

(Continued)

*Primary Examiner* — Khaja Ahmad

(74) *Attorney, Agent, or Firm* — Slater Matsil, LLP

(57) ABSTRACT

A circuit includes a Vdd node, and a two-port Static Random-Access Memory (SRAM) cell pair having a first SRAM cell and a second SRAM cell having a same structure. The first SRAM cell is a ten-transistor SRAM cell that comprises a first pull-up transistor and a second pull-up transistor, a first pull-down transistor and a second pull-down transistor forming a latch with the first pull-up transistor and the second pull-up transistor, a first pass-gate transistor and a second pass-gate transistor connecting to the latch, a p-type isolation transistor including a first source/drain region connecting to a drain region of the first pull-up transistor, and a gate connecting to the Vdd node. The circuit further includes a read bit-line shared with the second SRAM cell. and a write bit-line pair connecting to gates of the first pass-gate transistor and the second pass-gate transistor.

20 Claims, 16 Drawing Sheets

$12 \begin{cases} \text{10-1} \\ \text{10-2} \end{cases}$

(56)     References Cited

U.S. PATENT DOCUMENTS

| | | | | |
|---|---|---|---|---|
| 10,128,253 | B2 | 11/2018 | Liaw | |
| 10,170,480 | B2 | 1/2019 | Liaw | |
| 10,468,104 | B1 * | 11/2019 | Anand | G11C 16/26 |
| 11,189,340 | B1 | 11/2021 | Yu | |
| 11,587,872 | B2 | 2/2023 | Liaw | |
| 11,901,352 | B2 | 2/2024 | Liaw | |
| 11,997,844 | B2 | 5/2024 | Liaw | |
| 12,063,766 | B2 | 8/2024 | Yang | |
| 2008/0123462 | A1 | 5/2008 | Liaw | |
| 2011/0075470 | A1 | 3/2011 | Liaw | |
| 2014/0254248 | A1 * | 9/2014 | Huang | G11C 11/419 |
| | | | | 365/154 |
| 2016/0027499 | A1 * | 1/2016 | Liaw | H10D 84/853 |
| | | | | 365/154 |
| 2016/0148688 | A1 | 5/2016 | Barth, Jr. | |
| 2016/0155492 | A1 * | 6/2016 | Zhang | H10D 89/10 |
| | | | | 365/189.11 |
| 2017/0221904 | A1 | 8/2017 | Liaw | |
| 2017/0330614 | A1 | 11/2017 | Kwon | |
| 2019/0081050 | A1 | 3/2019 | Liaw | |
| 2020/0058656 | A1 | 2/2020 | Guo et al. | |
| 2021/0065784 | A1 | 3/2021 | Braceras | |
| 2025/0061940 | A1 * | 2/2025 | Kim | G11C 11/4094 |

FOREIGN PATENT DOCUMENTS

| | | | |
|---|---|---|---|
| KR | 20170090986 | A | 8/2017 |
| KR | 20180127288 | A | 11/2018 |
| TW | 202030866 | A | 8/2020 |
| TW | 202141703 | A | 11/2021 |
| TW | 202201656 | A | 1/2022 |
| TW | 202232486 | A | 8/2022 |
| TW | 202243140 | A | 11/2022 |
| TW | 202301340 | A | 1/2023 |

* cited by examiner

Active region
Gate
Contact
Gate via
S/D via0

TWO-PORT SRAM CELL STRUCTURE

PRIORITY CLAIM AND CROSS-REFERENCE

This application claims the benefit of the following provisionally filed U.S. patent application: Application No. 63/497,767, filed on Apr. 24, 2023, and entitled "Two-Port Cell Structure," which application is hereby incorporated herein by reference.

BACKGROUND

Static Random-Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. With the increasingly down-scaling of the already very small SRAM cells, however, such request is difficult to achieve. For example, the sheet resistance of metal lines, which form the word-lines and bit-lines of SRAM cells, becomes increasingly higher, and hence the RC delay of the word-lines and bit-lines of SRAM cells is increased, preventing the improvement in the read speed and write speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
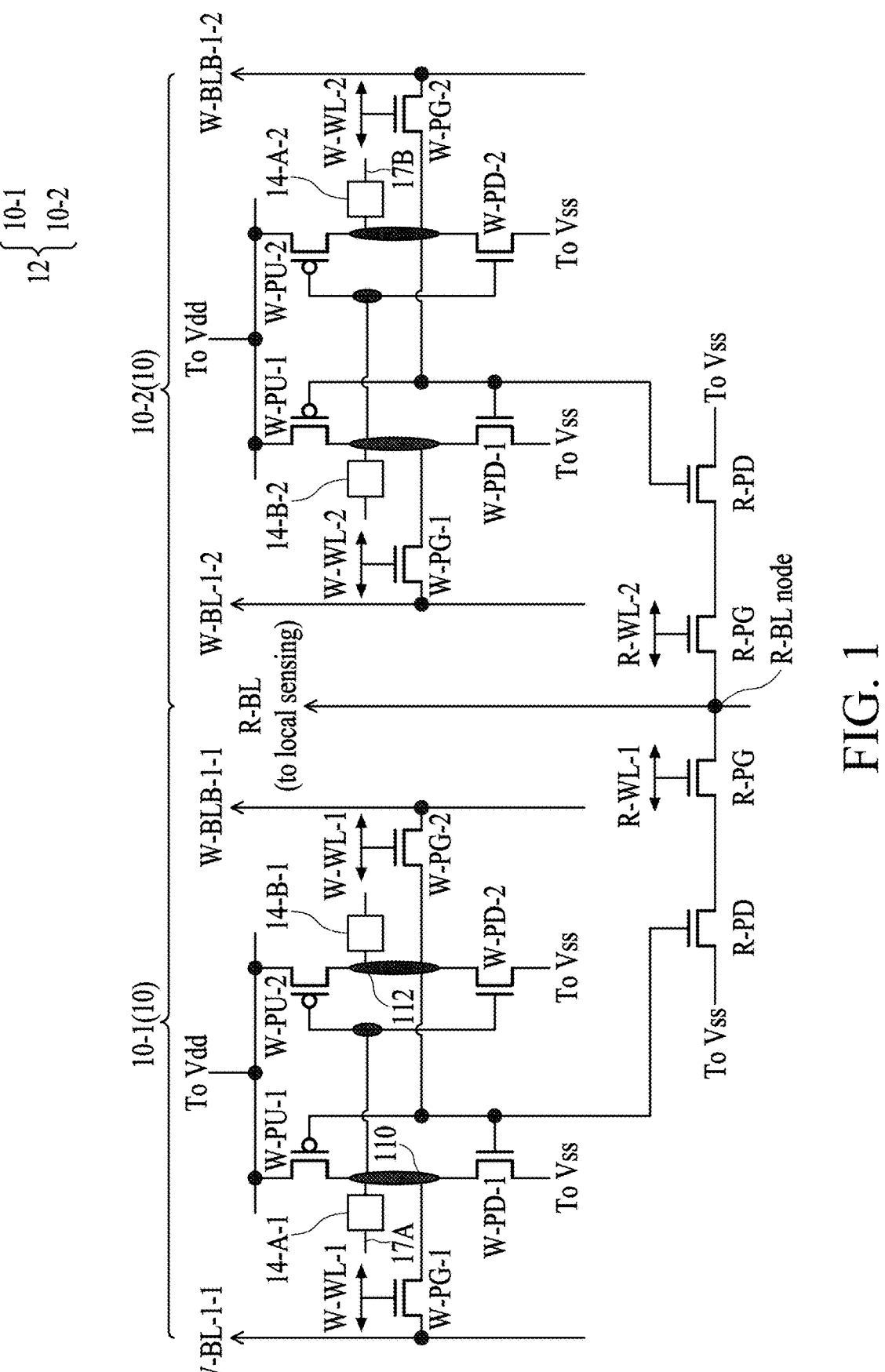
FIG. 1 illustrates a circuit diagram of a pair of two-port Static Random-Access Memory (SRAM) cells in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Two-port Static Random-Access Memory (SRAM) cell pairs and the corresponding layouts are provided in accordance with various example embodiments. In accordance with some embodiments, each of the two SRAM cells in a SRAM cell pair may be laid out as having an L-shape, and the pair of two SRAM cells fit with each other to have a rectangular shape. A same straight active region and a straight read bit-line may extend into the pair of two SRAM cells. Some variations of some embodiments are discussed. Throughout the various views and illustrative embodiments, like reference numbers are used to designate like elements. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a circuit diagram of a two-port SRAM cell pair 12, which includes two-port SRAM cells 10-1 and 10-2 in accordance with some embodiments. The two-port SRAM cells 10-1 and 10-2 share a common read bit-line R-BL, which leads to a local sensing circuit. SRAM cells 10-1 and 10-2 have a same structure. Accordingly, in the following discussion, SRAM cell 10-1 is discussed as an example, while the structure and the operation of SRAM cell 10-2 may be realized.

SRAM cell 10-1 includes a read port and a write port. The write port includes pull-up transistors W-PU-1 and W-PU-2, which are P-type Metal-Oxide-Semiconductor (PMOS) transistors, and pull-down transistors W-PD-1 and W-PD-2 and pass-gate transistors W-PG-1 and W-PG-2, which are N-type Metal-Oxide-Semiconductor (NMOS) transistors. The gates of pass-gate transistors W-PG-1 and W-PG-2 are controlled by write word-line W-WL-1, which determines whether SRAM cell 10-1 is selected for writing into or not. A latch formed of pull-up transistors W-PU-1 and W-PU-2 and pull-down transistors W-PD-1 and W-PD-2 stores a bit, wherein the complementary values of the bit are stored in Storage Data (SD) node 110 and SD node 112. The stored bit can be written into SRAM cell 10-1 through write bit-line pair W-BL-1-1 and W-BLB-1-1.

SRAM cell 10-1 is powered through a positive power supply node Vdd that has a positive power supply voltage (also denoted as Vdd). SRAM cell 10-1 is also connected to power supply voltage Vss (also denoted as Vss), which may be electrical ground. Transistors W-PU-1 and W-PD-1 form a first inverter. Transistors W-PU-2 and W-PD-2 form a second inverter. The input of the first inverter is connected to transistor W-PG-1 and the output of the second inverter. The output of the first inverter is connected to transistor W-PG-2 and the input of the second inverter.

The sources of pull-up transistors W-PU-1 and W-PU-2 are connected to the Vdd node, which is further connected to power supply voltage (and line) Vdd. The sources of pull-down transistors W-PD-1 and W-PD-2 are connected to the Vss node, which is further connected to power supply voltage/line Vss. The gates of transistors W-PU-1 and W-PD-1 are connected to the drains of transistors W-PU-2 and W-PD-2, which form a connection node that is referred to as SD node 112. The gates of transistors W-PU-2 and W-PD-2 are connected to the drains of transistors W-PU-1 and W-PD-1, which connection node is referred to as SD node 110. A source/drain region of pass-gate transistor W-PG-1 is connected to write bit-line W-BL-1-1. A source/drain region of pass-gate transistor W-PG-2 is connected to bit-line W-BLB-1-1.

SRAM cell 10-1 further includes a read port, which includes read pull-down transistor R-PD and read pass-gate transistor R-PG connected in series. The gate of read pull-down transistor R-PD is connected to SD node 112. The gate of transistor R-PG is connected to read word-line R-WL-1. A source/drain region of transistor R-PG is connected to read bit-line R-BL, which is connected to a local sensing circuit. A source/drain region of transistor R-PD is connected to voltage node Vss. In accordance with some embodiments, as shown in FIG. 1, read pass-gate transistor R-PG is closer to the R-BL node than the read pull-down transistor R-PD, and the read pull-down transistor R-PD is closer to the Vss node than read pass-gate transistor R-PG.

In accordance with some embodiments, the SRAM cell pair 12 (including SRAM cells 10-1 and 10-2 collectively) includes two bit-line pairs, the W-BL-1-1 and W-BLB-1-1 pair and the W-BL-1-2 and W-BLB-1-2 pair. The pair of SRAM cells 10-1 and 10-2 also include two write word-lines W-WL-1 and W-WL-2, two read word-lines R-WL-1 and R-WL-2, and one shared read bit-line R-BL. Accordingly, the write or read function may be served through these word-lines and bit-lines.

Each of the write pull-up transistors W-PU-1 and W-PU-2 in the SRAM cell pair 12 has an adjacent node-decoupling structure 14-A-1, 14-B-1, 14-A-2, or 14-B-2, which node-decoupling structures are collectively referred to as node-decoupling structures 14. By forming the node-decoupling structures 14, the uniformity of the density of gates may be improved. Each of node-decoupling structures 14-A-1 and 14-B-1 comprises a first semiconductor region and second semiconductor region, which may act as the source/drain region of the respective isolation transistor or dummy transistor (with dielectric gates). For example, node-decoupling structures 14-A-1 and 14-B-1 are connected to the drain regions of the write pull-up transistors W-PU-1 and W-PU-2, respectively.

The node-decoupling structure 14 are used to electrically decouple the drain regions (and the storage nodes) of the respective SRAM cell from the drain regions (and the storage nodes) of the respective SRAM cell in the neighboring SRAM cell pair. For example, assuming another SRAM cell pair identical to SRAM cell pair 12 is on the left of the illustrated SRAM cell pair 12, the left node 17A of node-decoupling structure 14-A-1 will be decoupled from the node 17B (and the storage node) of the other SRAM cell pair 12 on the left side of the illustrated SRAM cell pair 12.

Figure 2:
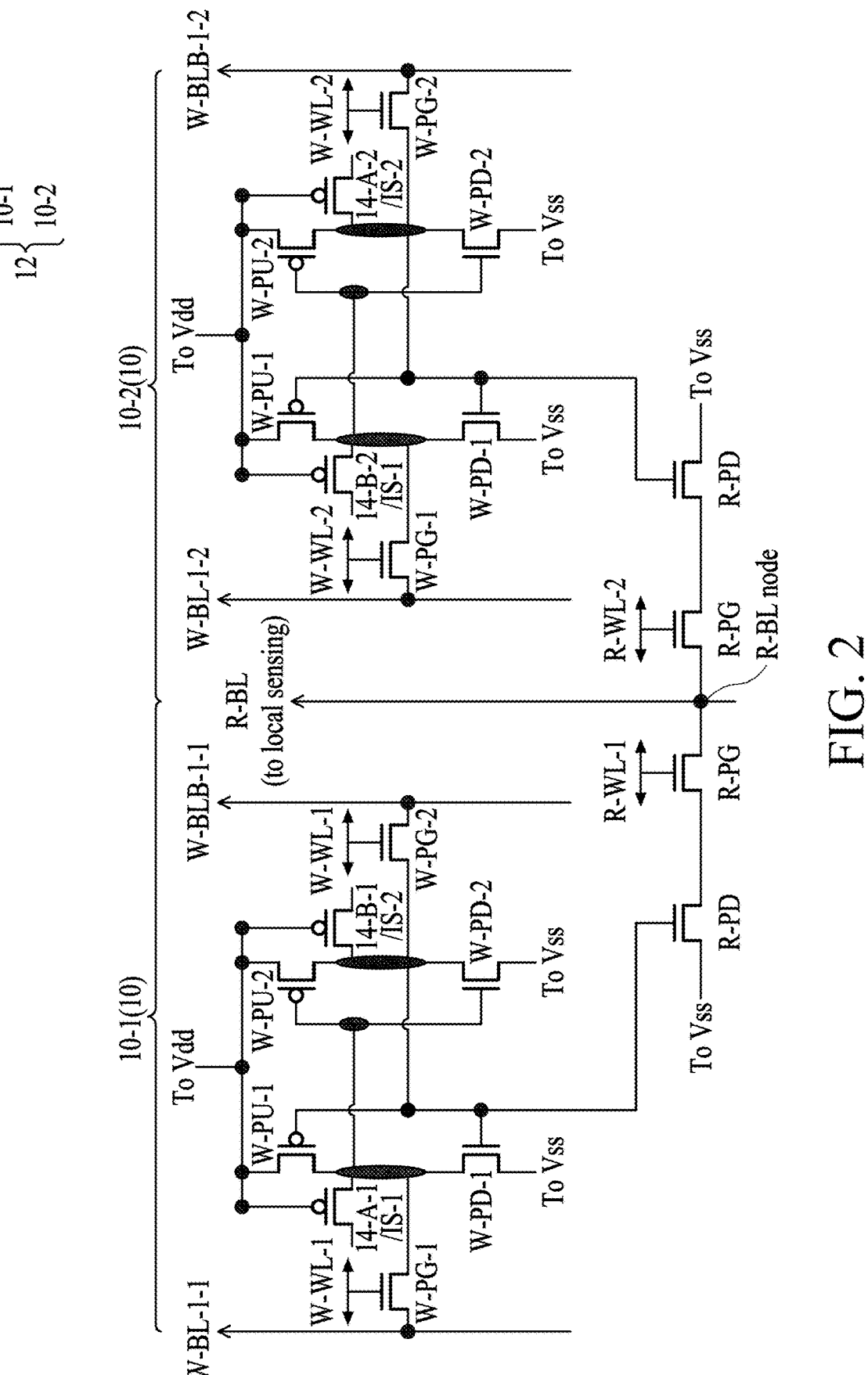
FIG. 2 illustrates a circuit diagram of a pair of two-port ten-transistor (10T) SRAM cells in accordance with some embodiments.

FIG. 2 illustrates the circuit diagram of a SRAM cell pair 12 implementing the circuit SRAM cell pair 12 as shown in FIG. 1. The node-decoupling structures 14-A-1 and 14-B-1 in FIG. 1 are implemented using transistors IS-1 and IS-2, respectively, in FIG. 2, which transistors are also referred to as isolation transistors. The corresponding SRAM cells 10-1 and 10-2 are thus ten-transistor (10T) SRAM cells. A detailed structure of the isolation transistors may be shown in FIG. 8 as an example.

In accordance with some embodiments, isolation transistors IS-1 and IS-2 are pMOS transistors. The gates of isolation transistors IS-1 and IS-2 may be connected to power supply node Vdd. Alternatively, isolation transistors IS-1 and IS-2 may be nMOS transistors, and hence the gates of isolation transistors IS-1 and IS-2 may be connected to power supply node Vss. Accordingly, isolation transistors IS-1 and IS-2 are constantly turned off to disconnect the storage data node 110 of the SRAM cell 10-1 from the neighboring SRAM cell pairs 12.

Figure 3:
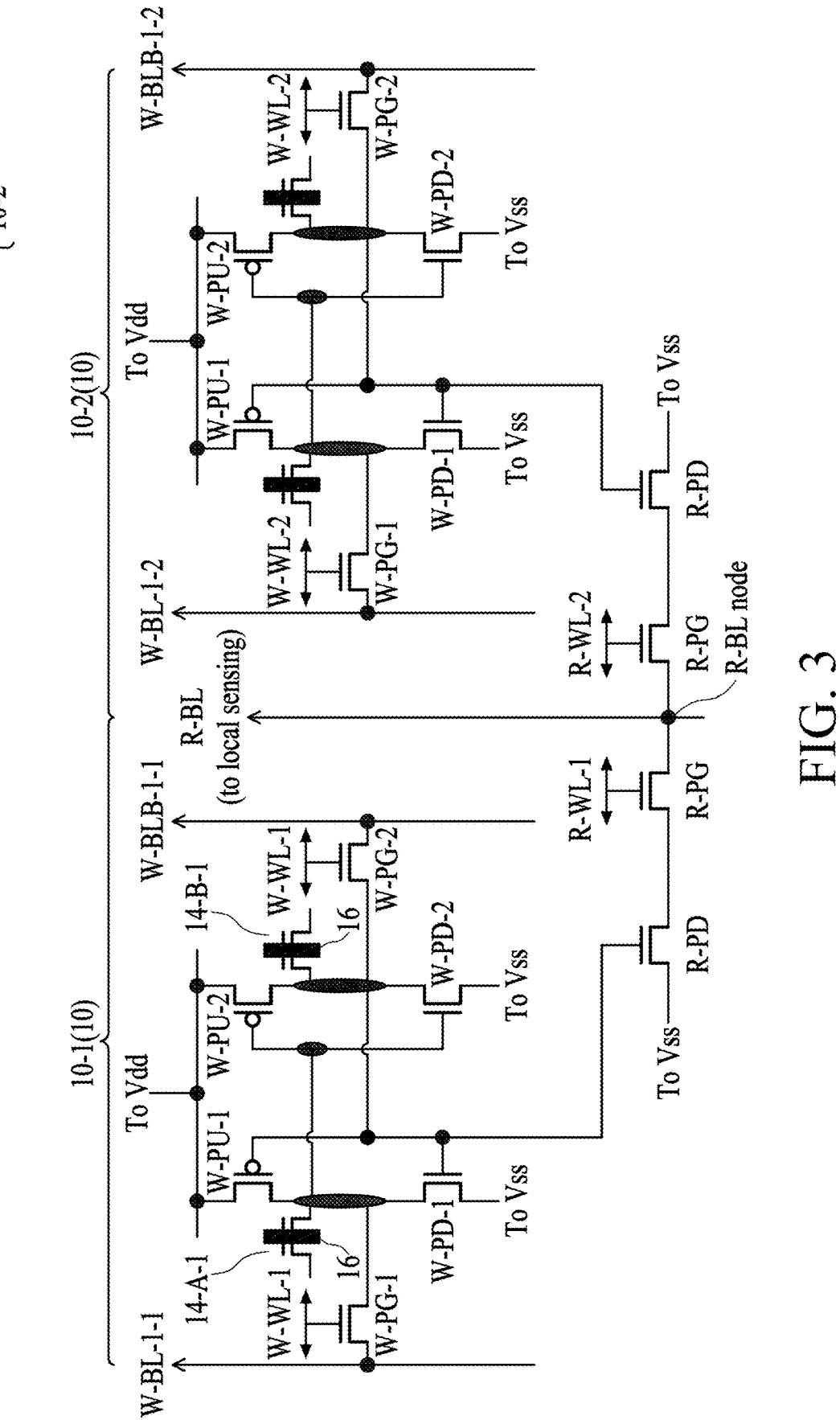
FIG. 3 illustrates a circuit diagram of a pair of two-port eight-transistor (8T) SRAM cells in accordance with some embodiments.

FIG. 3 illustrates another implementation of the circuit of SRAM cell pair 12 as shown in FIG. 1, wherein the node-decoupling structures 14-A-1 and 14-B-1 are implemented using dielectric gates. The corresponding node-decoupling structures may also be referred to as dummy transistors having dielectric gates. The corresponding node-decoupling structures 14-A-1 and 14-B-1 have similar structures as transistors, except that the gates and the underlying active regions (semiconductor regions) are replaced with dielectric regions 16. A detailed structure of the corresponding isolation transistors may be shown in FIG. 9 as an example. Since node-decoupling structures 14-A-1 and 14-B-1 no longer function as transistors, the corresponding SRAM cells are 8T SRAM cells. Node-decoupling structures 14-A-1 and 14-B-1 are also used to disconnect the storage nodes 110 of the SRAM cells 10-1 from the neighboring SRAM cell pairs 12.

Figure 4:
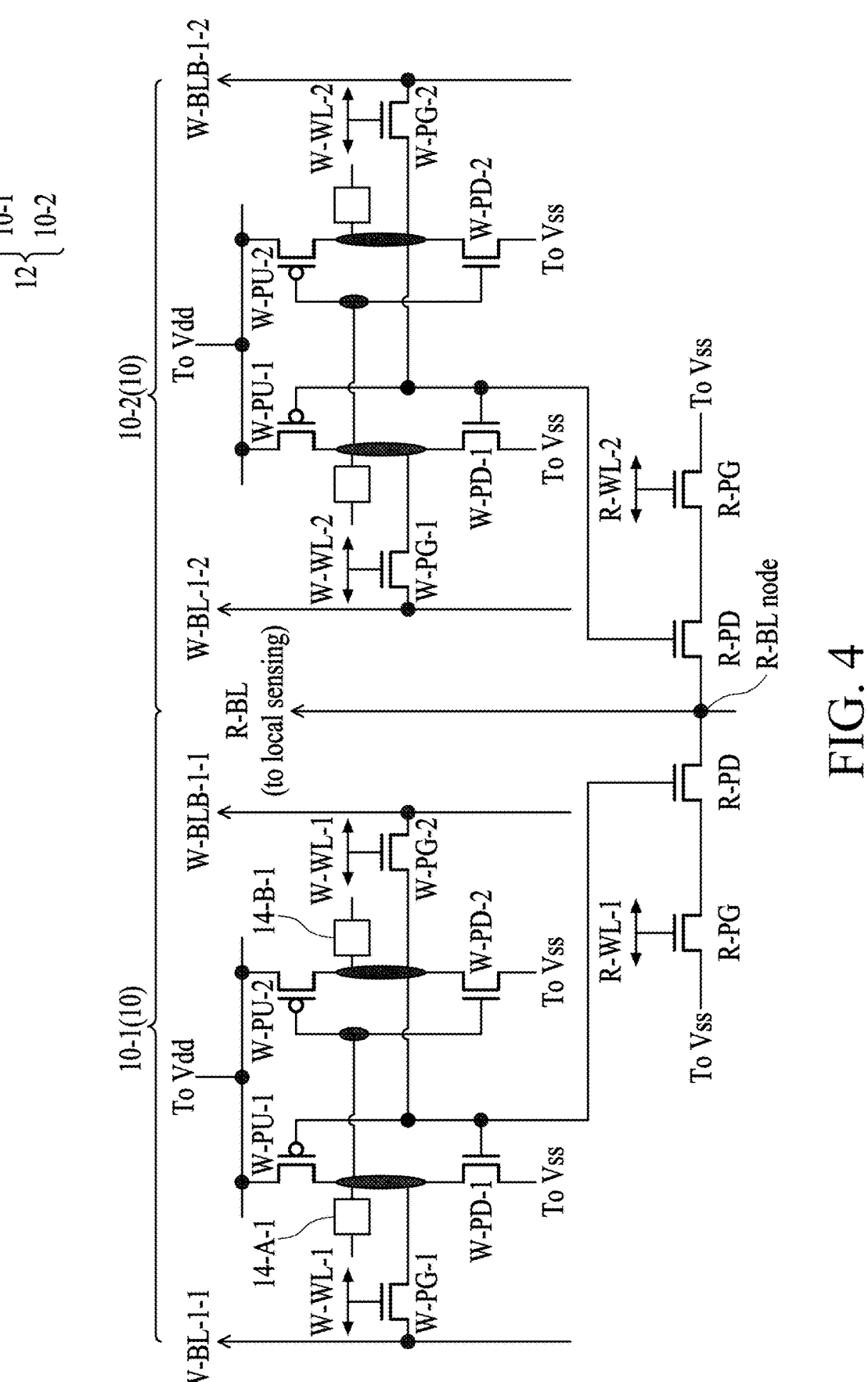
FIGS. 4-6 illustrate the circuit diagram of two-port SRAM cells in accordance with some embodiments.
Figure 5:
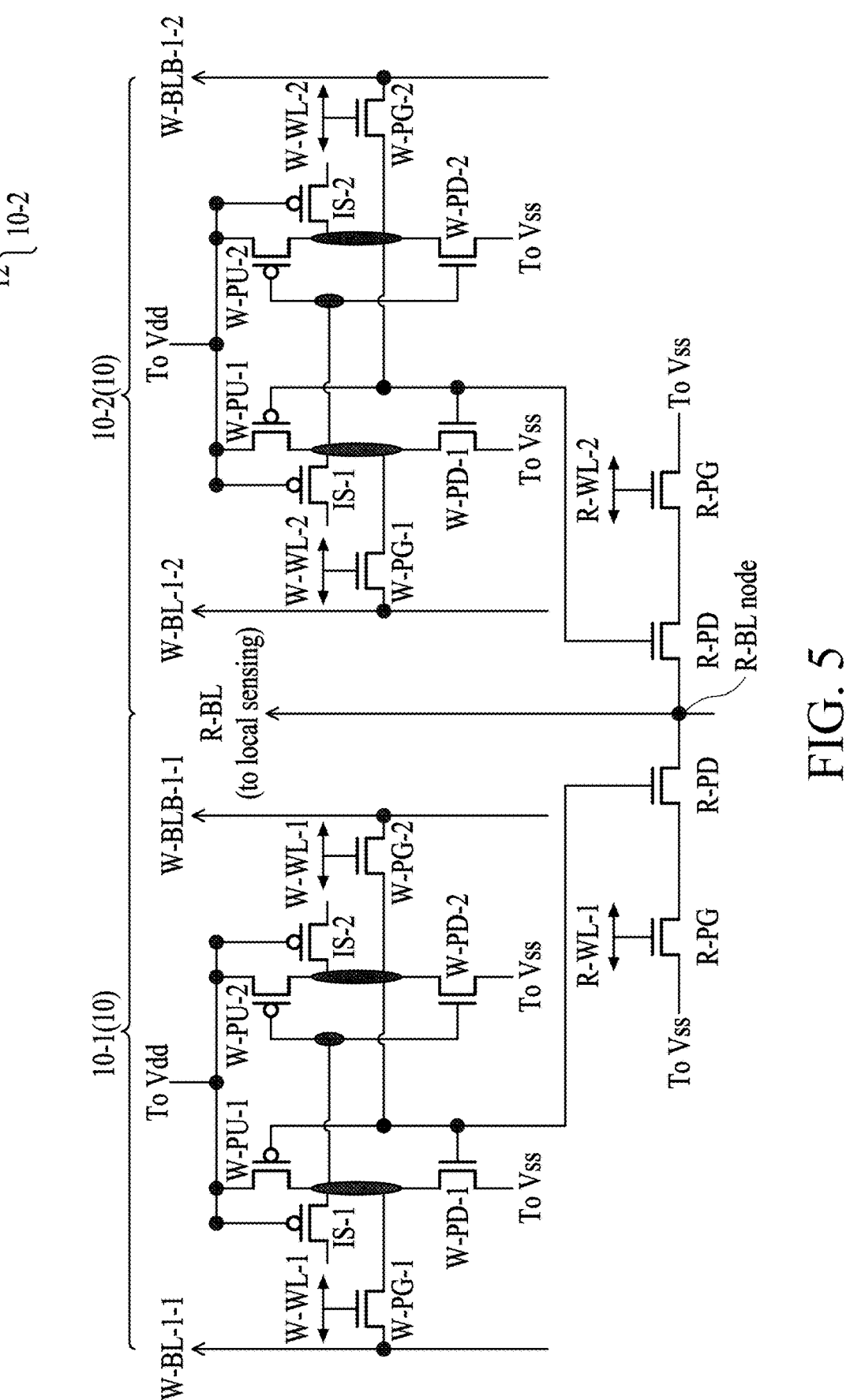
Figure 6:
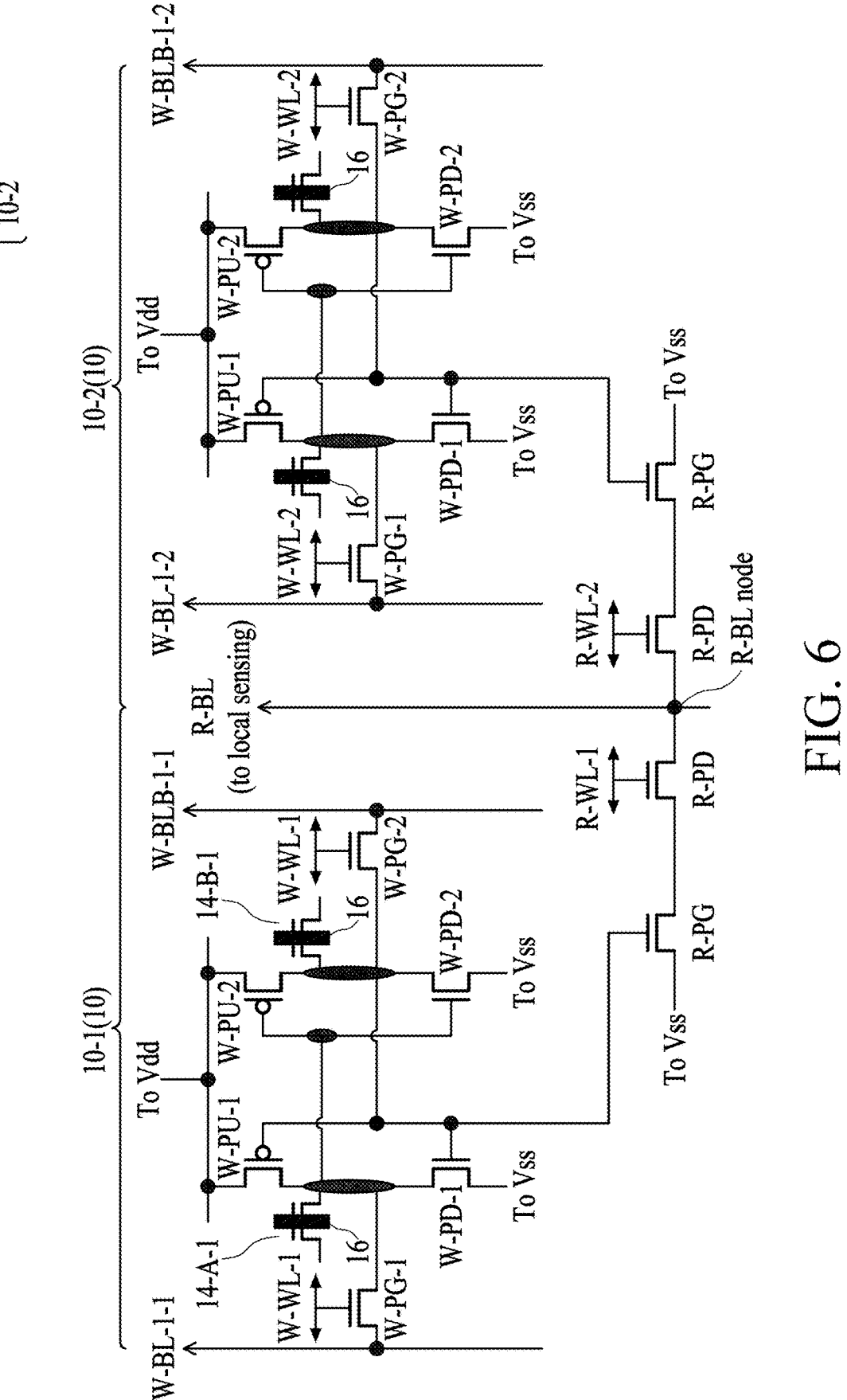

FIGS. 4, 5, and 6 illustrate the circuit diagram of some two-port SRAM cell pairs 12 in accordance with alternative embodiments. These embodiments are essentially the same as the embodiments shown in FIGS. 1, 2, and 3, respectively, except that the positions of the read pull-down transistor R-PD and read pass-gate transistor R-PG are switched. For example, in the embodiments shown in FIGS. 1, 2, and 3, the read pass-gate transistor R-PG is between the read pull-down transistor R-PD and the R-BL node, and the read pull-down transistor R-PD is between the read pass-gate transistor R-PG and the Vss node. In the embodiments shown in FIGS. 4, 5, and 6, conversely, the read pass-gate transistor R-PG is between the read pull-down transistor R-PD and the Vss node, and the read pull-down transistor R-PD is between the read pass-gate transistor R-PG and the R-BL node.

Figure 7:
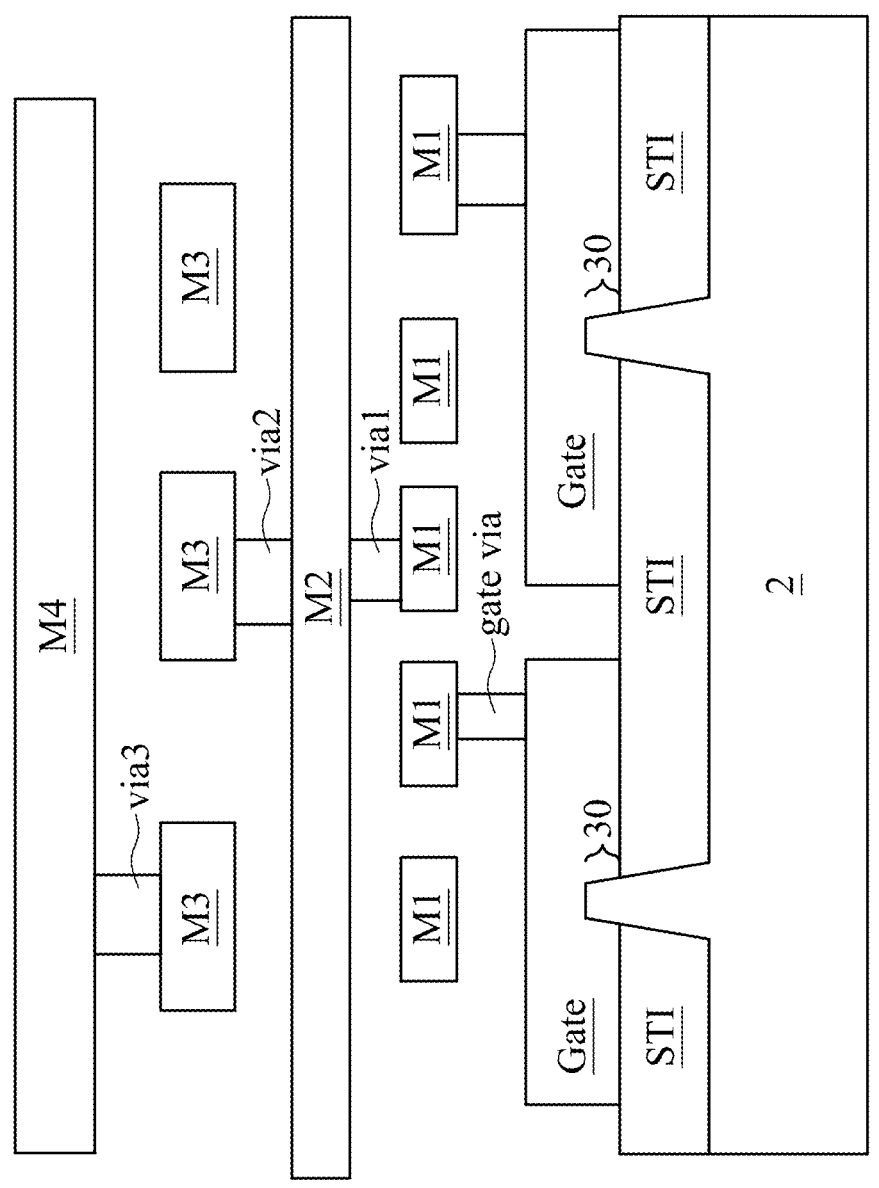
FIG. 7 schematically illustrates the layers of transistors in the two-port SRAM cells and the overlying contact plugs, vias, and metal layers in accordance with some embodiments.

FIG. 7 illustrates a schematic cross-sectional view of a plurality of layers in which SRAM cell 10-1 and 10-2 may be formed, which layers are formed on a semiconductor chip or wafer. It is noted that FIG. 7 is schematically illustrated to show various levels of interconnect structure and transistors, and may not reflect the actual cross-sectional view of SRAM cells. In accordance with some embodiments, the interconnect structure includes metal layers M1, M2, M3, and M4, with metal layer M1 being the bottommost metal layer in the respective die/wafer. The interconnect structure further includes active regions (also referred to as ODs), gate vias, vias via0 (not shown in FIG. 7, refer to FIG. 10), vias via1, vias via2, and vias via3. Each of the illustrated metal layers includes a plurality of metal features formed therein, with one or more dielectric layers surrounding the metal features.

The metal features that are at the same level may have top surfaces substantially level to each other, bottom surfaces substantially level to each other, and may be formed simultaneously. The gate vias may include gate contacts (also referred to as contact plugs) for connecting the gate electrodes of transistors (such as the illustrated example transistors W-PU-1 and W-PU-2) to overlying features such as the metal features in metal layer M1, and source/drain contacts (marked as "S/D via0" in FIG. 10) for connecting the source/drain regions of transistors to the overlying metal features.

FIG. 7 illustrates active regions (OD) 30 in accordance with some embodiments in which FinFETs are adopted to form the SRAM cells. Active regions 30 are portions of the semiconductor regions protruding higher than the Shallow Trench Isolation (STI) regions to form protruding semiconductor fins. STI regions are over bulk semiconductor substrate 2. The active regions are used for forming the channel regions, and possibly the source/drain regions, of the transistors. Accordingly, the corresponding transistors are Fin-FETs. In accordance with other embodiments, other types of transistors such as GAA transistors (illustrated in FIGS. 8 and 9), planar transistors, and the like may be adopted.

Figure 8:
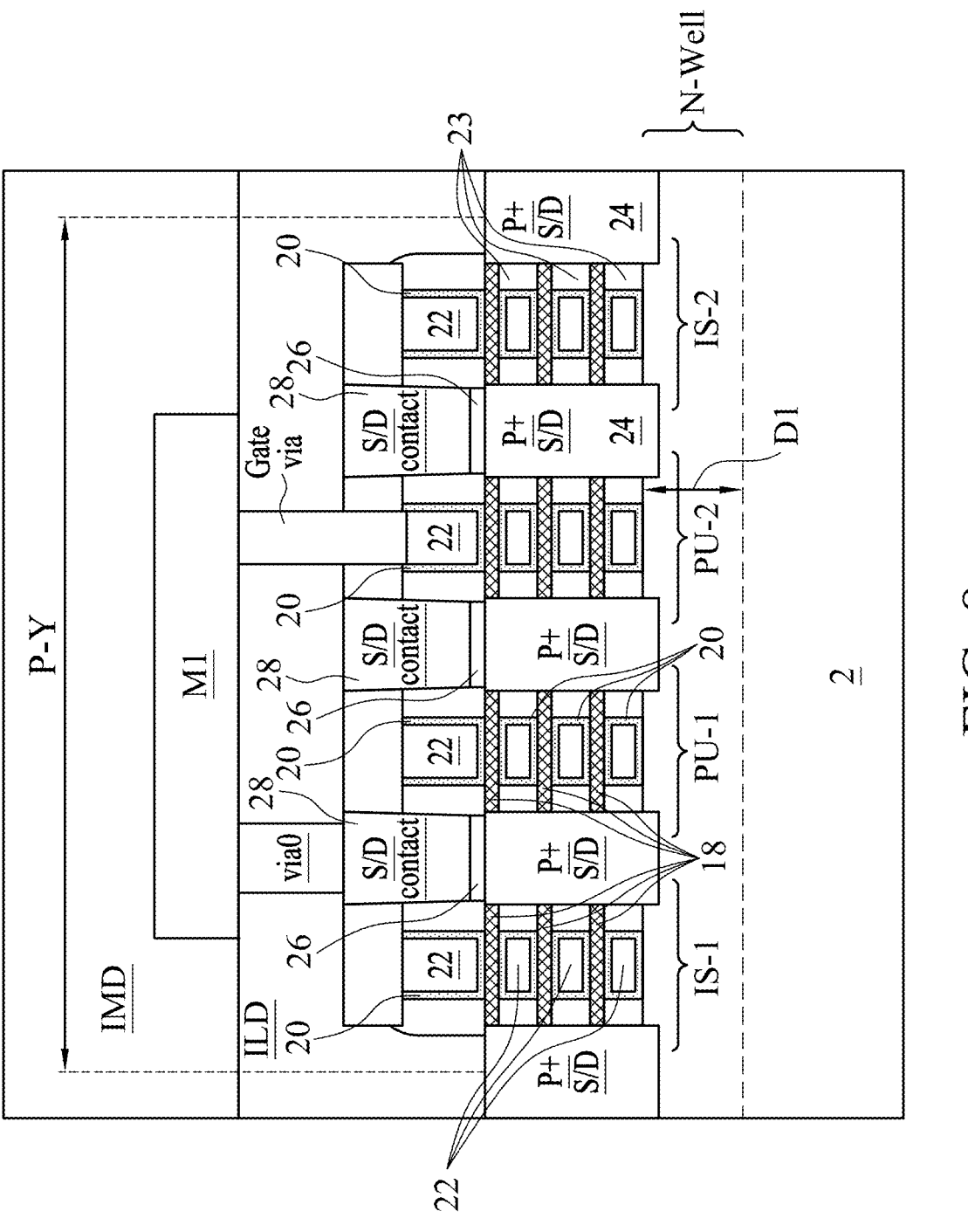
FIG. 8 illustrates a cross-sectional view of some Gate-All-Around (GAA) transistors including Isolation transistors (IS) in accordance with some embodiments.

FIG. 8 illustrates a cross-sectional view of a part of a SRAM cell 10-1 or 10-2 in accordance with some embodiments, with various layers illustrated as an example. Isolation transistors IS-1 and IS-2 (also refer to FIG. 10) are adopted as the node-decoupling structures 14 (FIGS. 2 and 5). The transistors are implemented as GAA transistors in the illustrated example, while other types of transistors such as FinFETs, planar transistors, or the like, may also be adopted. The cross-section may also be obtained from the cross-section 8-8 in the layout shown in FIG. 10 in accordance with some embodiments.

The GAA transistors may include nanostructures 18, which may be silicon nanosheets or nanowires in accordance with some embodiments. The gate stacks including gate dielectrics 20 and gate electrodes 22 are formed to wrap around the nanostructures 18. Source/drain regions 24 (which may be semiconductor regions) are formed on the opposite ends of nanostructures 18. Source/drain region(s) may refer to a source or a drain, individually or collectively dependent upon the context.

Inner spacers 23, which are dielectric regions, are formed to isolate the source/drain regions 24 from the gate stacks 20/22. Source/drain silicide regions 26 and source/drain contact plugs 28 are over and connected to the source/drain regions 24. Gate vias are over and connected to the gate electrodes 22. Inter-Layer Dielectric (ILD) are also formed. The metal layers such as M1, M2, M3, M4 and via layers (including vias via1, via2, via3 collectively) and the like (similar to what are shown in FIG. 7) may be formed over the gate vias. The metal layers and via layers are formed in inter-metal dielectrics (IMDs).

In FIG. 8, a N-well region is formed to extend into substrate 2, which may be a silicon substrate. The N-well region may have a depth D1 in the range between about 15 nm and about 150 nm. The N-well region may be doped with an n-type dopant such as phosphorous.

Figure 9:
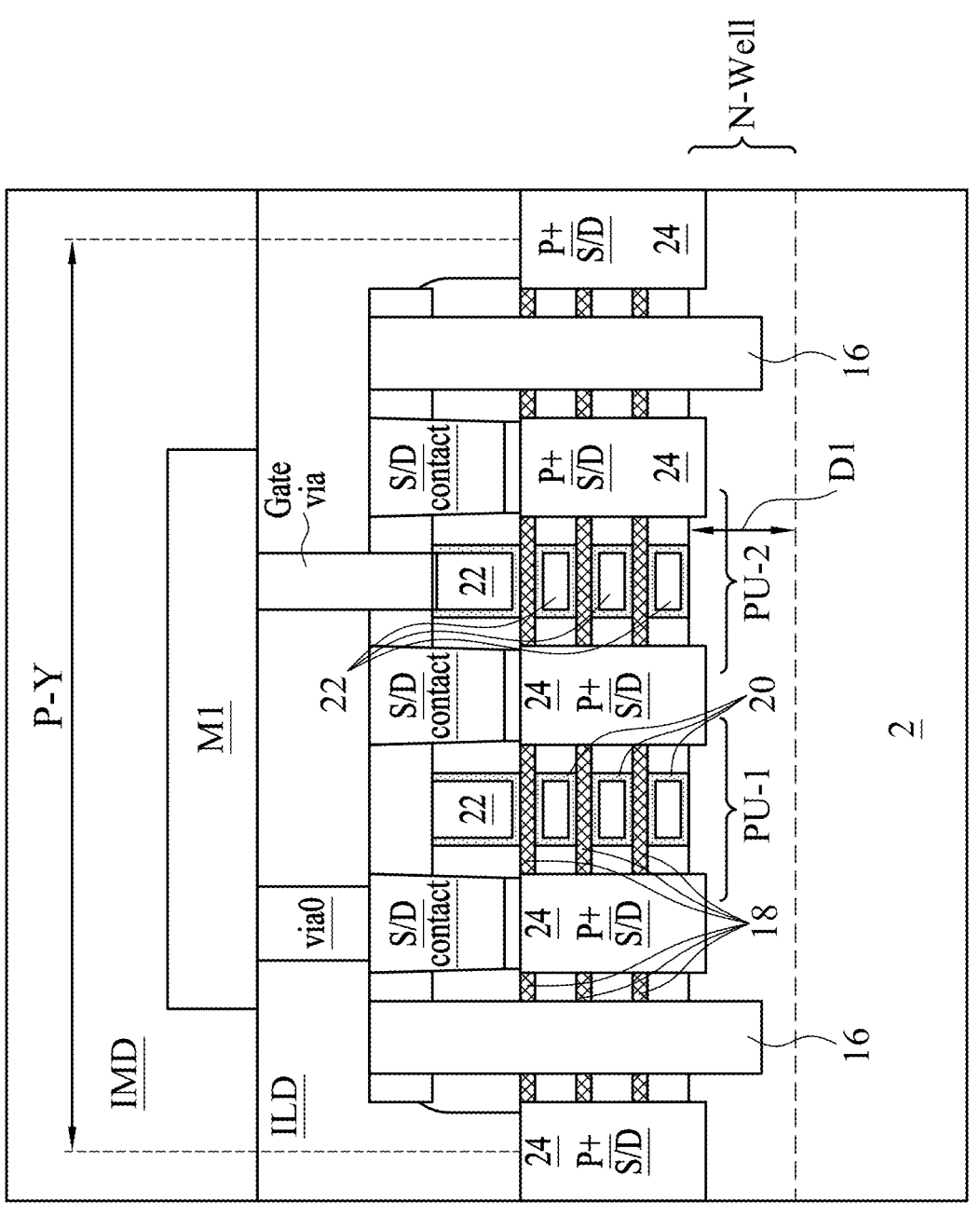
FIG. 9 illustrates a cross-sectional view of some Gate-All-Around (GAA) transistors including dielectric gates in accordance with some embodiments.

FIG. 9 illustrates a cross-sectional view of a part of a SRAM cell 10-1 or 10-2 in accordance with some embodiments, with various layers illustrated as an example. Dummy transistors including dielectric gates 16 (also refer to FIG. 12) are adopted as the node-decoupling structures 14 (FIGS. 3 and 6). The transistors are also implemented as GAA transistors in the illustrated example, while other types of transistors such as FinFETs, planar transistors, or the like, may also be adopted. The cross-section may also be obtained from the cross-section 9-9 in the layout shown in FIG. 12 in accordance with some embodiments.

The structure shown in FIG. 9 is essentially the same as shown in FIG. 8, except that the gate stacks of the transistors IS-1 and IS-2 (shown in FIG. 8) and some parts of the underlying active regions are replaced as dielectric regions 16 as shown in FIG. 9. The formation process may include etching the gate stacks and the underlying active regions to form trenches, and filling the resulting trenches with a dielectric material(s). The dielectric material may be a homogenous dielectric material such as silicon oxide, silicon nitride, silicon oxynitride, silicon oxycarbide, or the like, or combinations thereof. Alternatively, the dielectric material may include a multi-layer structure including a plurality of dielectric layers, each being formed of silicon oxide, silicon nitride, silicon oxynitride, silicon oxycarbide, or the like, or combinations thereof. The dielectric regions 16 extend into the N-well region, and electrically isolate the source/drain regions on the opposite sides of the corresponding dielectric regions 16.

Figure 10:
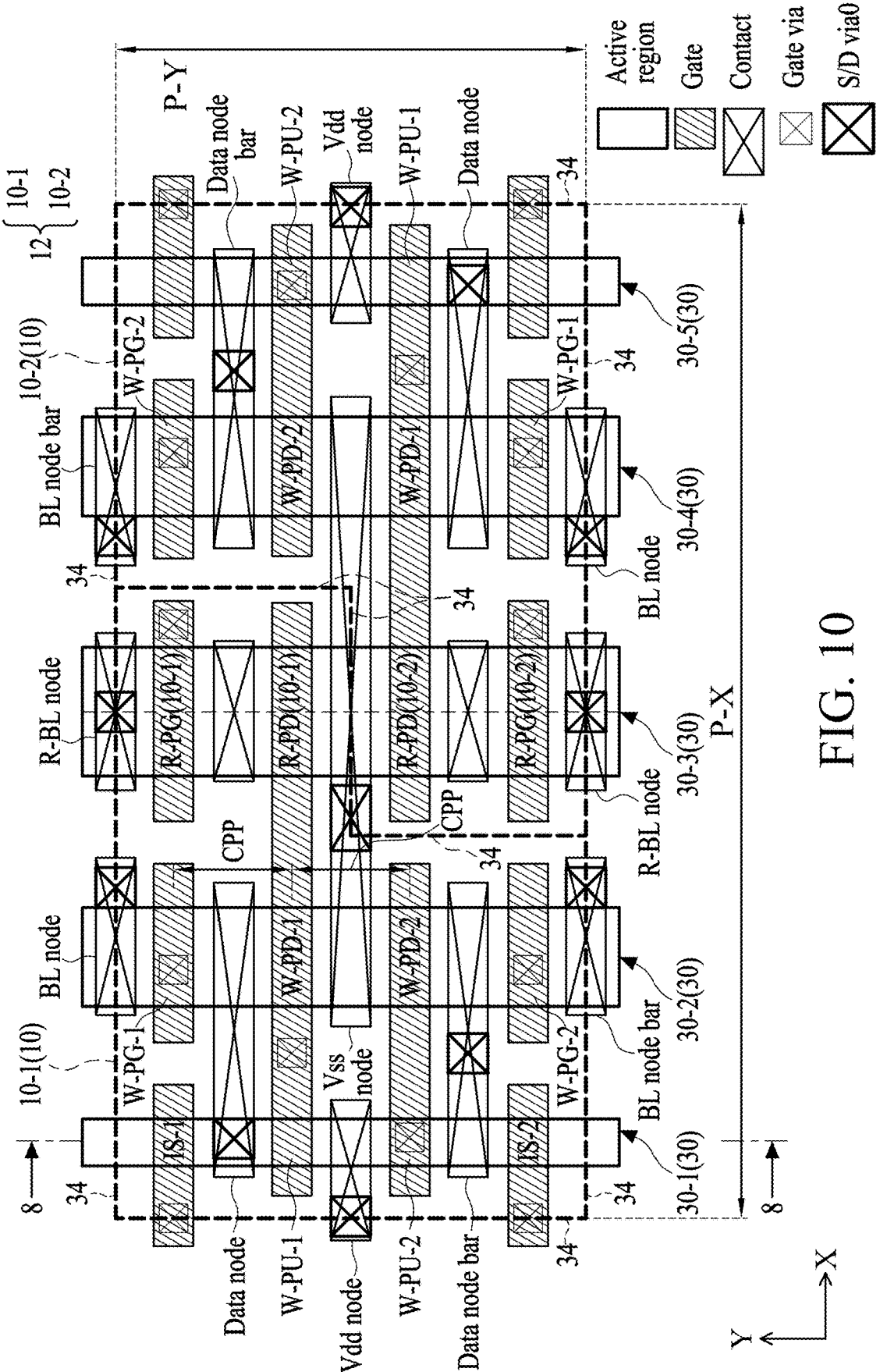
FIG. 10 illustrates a layout of a pair of two-port 10T SRAM cells including Isolation transistors (IS) in accordance with some embodiments.

FIG. 10 illustrates a layout of an SRAM cell pair 12 in accordance with some embodiments. The implemented SRAM cells are shown in FIG. 2, and each of the SRAM cells 10-1 and 10-2 includes ten transistors (10T). Throughout the description, the figures illustrating the layouts of integrated circuits also illustrate the top views of the integrated circuits that are manufactured on physical wafers and on semiconductor substrates. SRAM cell pair 12 includes SRAM cells 10-1 and 10-2 abutting each other, and arranged in the X direction. The length of the SRAM cell pair 12 is P-X, which is measured in the X direction. The width of the SRAM cell pair 12 is P-Y, which is measured in the Y direction. The X-pitch of the SRAM cells 10 (including 10-1 and 10-2) (measured in the X direction) is equal to P-X/2, and the Y-pitch of the SRAM cell cells 10 (measured in the Y direction) is equal to P-Y. Both of the Y-pitch of the SRAM cell pair 12 and the Y-pitch of the individual SRAM cells 10-1 and 10-2 (measured in the Y direction) in the Y direction are equal to P-Y. The Y-pitch P-Y include four gate pitches (4×CPP).

The cell area of each of SRAM cells 10-1 and 10-2 is equal to (P-X*P-Y)/2. As shown in FIG. 10, the Y-pitch of each of SRAM cells 10-1 and 10-2 is relatively large compared to the X-direction length of the SRAM cells 10-1 and 10-2. This allows the word-lines R-WL and W-WL (FIG. 14) to be wider, and the word-line resistance is lower. Since the writing speed is more sensitive to the resistance of the word-lines, making word-lines to be wider may improve the writing speed.

Figure 11:
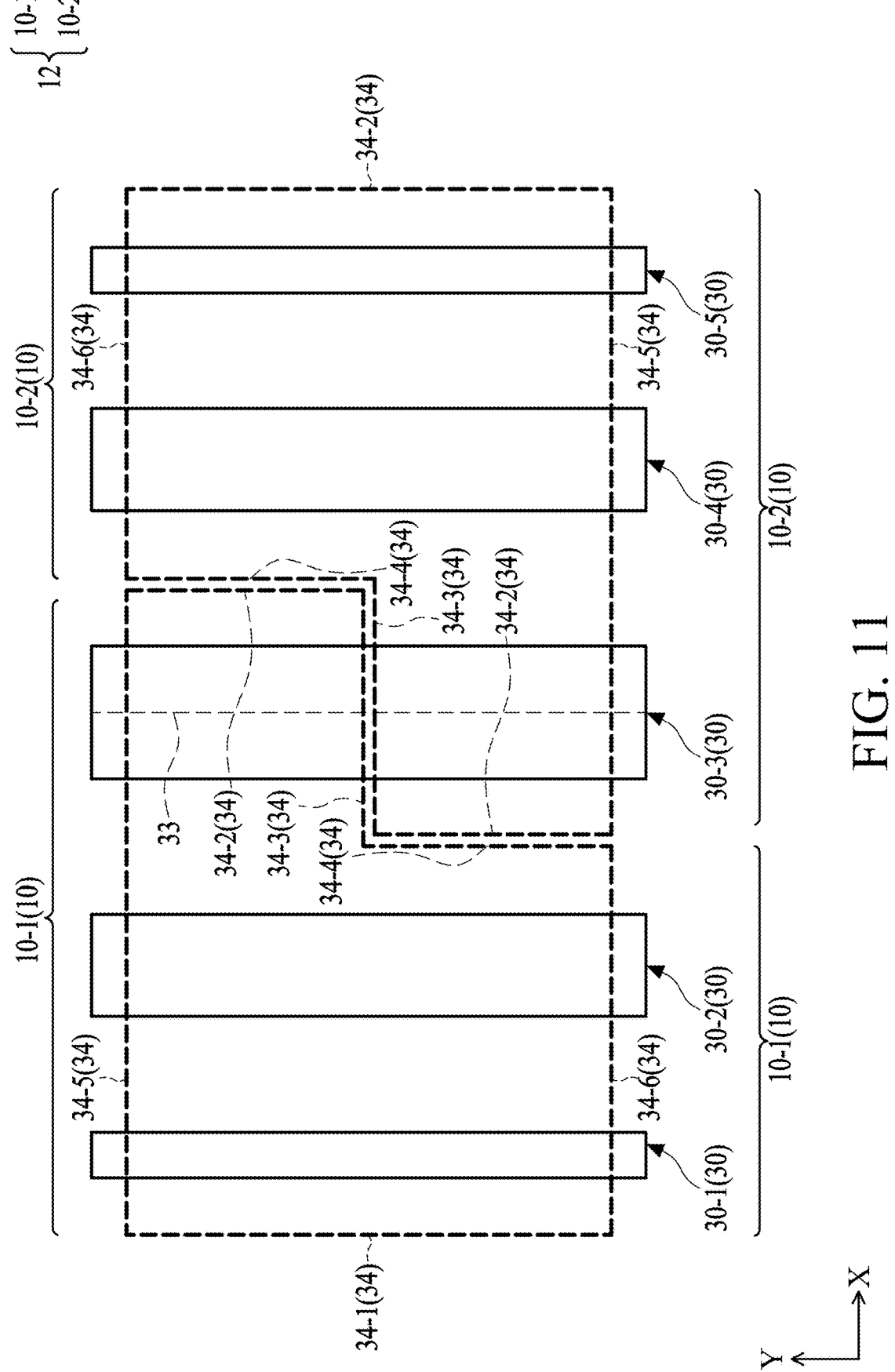
FIG. 11 illustrates the boundaries of a pair of two-port SRAM cells in accordance with some embodiments.

Each of SRAM cells 10-1 and 10-2 has a non-rectangular shape. FIG. 11 illustrates the boundaries 34 (including boundaries (and boundary sections) 34-1, 34-2, 34-3, 34-4, 34-5, and 34-6) and the active regions of the SRAM cell pair 12 as shown in FIG. 10 for easier distinction, while other features in FIG. 10 are not shown in FIG. 11. In FIG. 11, the boundary sections 34-2, 34-3, and 34-4 of SRAM cell 10-1 join (although they are shown as being spaced apart for visual distinction purpose) the corresponding boundary sections 34-4, 34-3, and 34-2, respectively, of SRAM cell 10-2. In accordance with some embodiments, each of SRAM cells 10-1 and 10-2 has an L-shape, and are fitted with each other to have a rectangular shape. The inner boundary separating SRAM cell 10-1 from SRAM cell 10-2 is not straight, and includes three sections 34-2, 34-3, and 34-4.

As shown in FIGS. 10 and 11, five active regions 30 are formed as a plurality of elongated parallel strips, and include active regions 30-1, 30-2, 30-3, 30-4, and 30-5. Active regions 30 may include protruding semiconductor fins as shown in FIG. 7 when the transistors are FinFETs, or may include nanosheets 18 (FIGS. 8 and 9) when the transistors are GAA transistors. The FinFETs may be single-fin Fin-FETs or multi-fin FinFETs, or combinations thereof. The GAA transistors may include single-nanosheet GAA transistors and/or multi-nanosheet GAA transistors including vertically stacked nanosheets (or nano-wires or fork-sheets), or combinations thereof.

SRAM cell 10-1 includes active regions 30-1 and 30-2. SRAM cell 10-2 includes active regions 30-4 and 30-5. Active region 30-3 is shared by SRAM cell 10-1 and 10-2. Accordingly, the SRAM cells 10-1 and 10-2 have fewer active region strips, with each having 2.5 (five active regions divided by two) active region strips. It is appreciated that the middle line 33 (FIG. 11) of active region 30-3 will also be the middle line of the portion of the active region 30-3 in SRAM cell 10-1 and the middle line of the portion of the active region 30-3 in SRAM cell 10-2.

Figure 13:
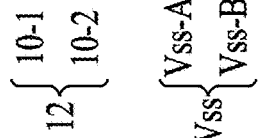
FIG. 13 illustrates the M1 features of a pair of two-port SRAM cells in accordance with some embodiments.

As shown in FIG. 10, active region 30-3 is used for forming read-port transistors R-PG and R-PD for both of SRAM cells 10-1 and 10-2. Active regions 30-1, 30-2, 30-4, and 30-5 are used for forming write-port transistors and isolation transistors. Active regions 30-1 and 30-5 are used for forming write-port pull-up transistors W-PU-1 and W-PU-2 and isolation transistors IS-1 and IS-2, which may be of the same type, for example, may be p-type transistors. Active regions 30-2 and 30-4 are used for forming write-port pull-down transistors W-PD-1 and W-PD-2 and pass-gate transistors W-PG-1 and W-PG-2, which may be of the same type, for example, may be n-type transistors. The source nodes of the four write-port pull-down transistors and the two read-port pull-down transistors may share one elongated contact plug, which is marked as "Vss node" and is in the middle of the SRAM cell pair 12. The elongated contact plug marked as "Vss node" is electrically connected to a power line Vss that is in the M1 layer (FIG. 13).

FIG. 10 also illustrates the gates of transistors, which have lengthwise directions in the X direction. The gates form transistors with the parts of the active regions that intersect and pass under the gates. Furthermore, FIG. 10 illustrates the contact plugs as horizontally elongated rectangles (with diagonal lines therein), gate vias shown by smaller squares (with diagonal lines therein), and source/drain vias S/D via0 shown by large squares (with diagonal lines therein). The Vss node, Vdd node, BL node, R-BL node, BL node bar, etc. are also illustrated. The nodes may be determined by comparing to the circuit diagram as shown in FIG. 2.

As shown in FIG. 10, by forming isolation transistors IS-1 and IS-2, the gates of the isolation transistors IS-1 and IS-2 fill the otherwise gate-sparse regions, and the density of the gates in the SRAM cell pair is more uniform. The isolation transistors IS-1 and IS-2 are always turned off, and hence will not adversely affect the functionality of the SRAM cell pair 12.

Figure 12:
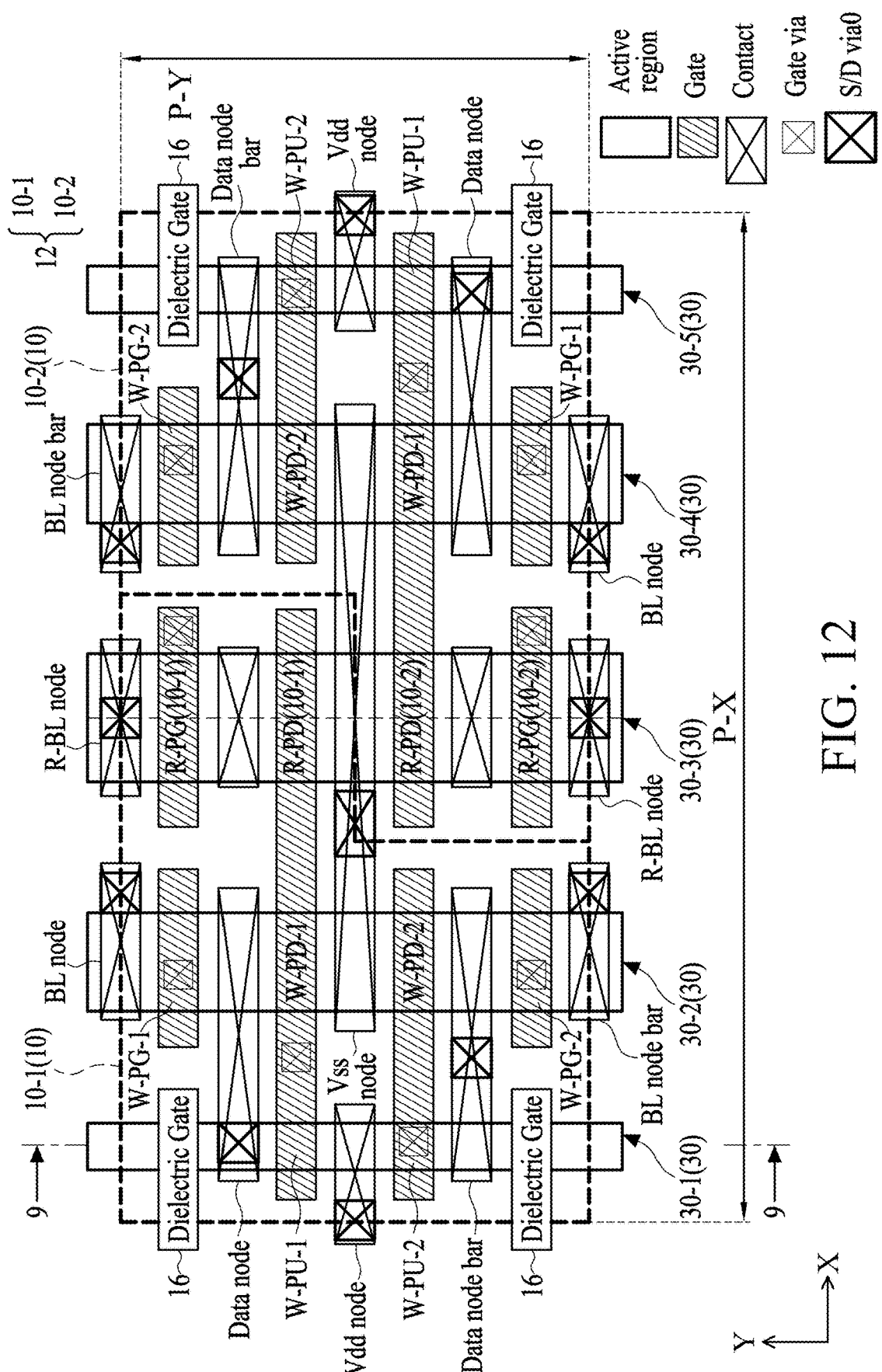
FIG. 12 illustrates a layout of a pair of two-port 8T SRAM cells including dielectric gates as node-decoupling structures in accordance with some embodiments.

FIG. 12 illustrates a layout of an SRAM cell pair 12 in accordance with alternative embodiments. The circuit diagram of the corresponding SRAM cell pair 12 is shown in FIG. 3, and each of the SRAM cells 10-1 and 10-2 includes 8 transistors (8T). The layouts of the SRAM cell pair 12 in FIG. 12 are essentially the same as what is shown in FIG. 10, except that the gates and the active regions of the isolation transistors IS-1 and IS-2 in FIG. 10 are replaced with dielectric gates (dielectric regions 16 as in FIG. 9). Accordingly, there are no isolation transistors formed, and each of SRAM cells 10-1 and 10-2 include eight transistors.

As shown in FIG. 12, active region 30-3 is used for forming read-port transistors R-PG and R-PD for both of SRAM cells 10-1 and 10-2. Active regions 30-1 and 30-5 are used for forming the dielectric gates and write-port transistors W-PU-1 and W-PU-2. Active regions 30-2 and 30-4 are used for forming write-port pull-down transistors W-PD-1 and W-PD-2 and pass-gate transistors W-PG-1 and W-PG-2, which may be of the same type, for example, may be n-type transistors.

Figure 14:
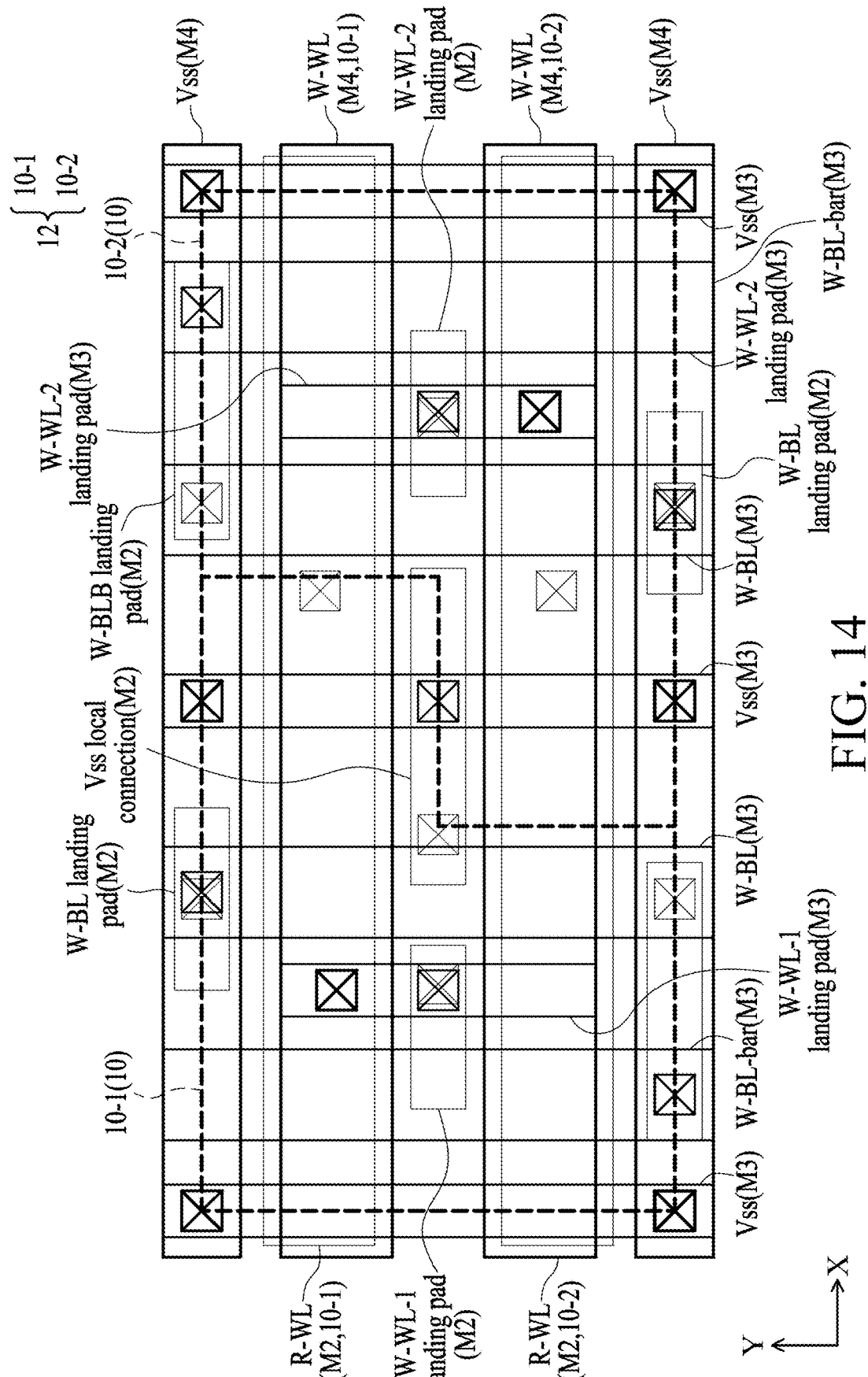
FIG. 14 illustrates the M2, M3, and M4 features of a pair of two-port SRAM cells in accordance with some embodiments.

FIG. 13 illustrates some example metal lines in the M1 layer in accordance with some embodiments. Throughout the drawings, the metal layers in which the corresponding metal features are located may be marked in parenthesis following the reference notation of the metal features. For example, the notation "Vdd (M1)" indicates that the corresponding metal line Vdd is in metal layer M1. As shown in FIG. 13, the lengthwise directions of the elongated metal lines in M1 layer are in the Y direction. In accordance with some embodiments, the metal features as shown in FIGS. 13 and 14 may be considered as parts of the SRAM cells. Alternatively, the structures as shown in FIGS. 10 and 12 may be considered as SRAM cells, and the metal features as shown in FIGS. 13 and 14 may be considered as the parts above the SRAM cells.

Two power lines Vdd are placed on the opposite boundaries of the SRAM cell pair 12, and thus are to be shared by neighboring SRAM cell pairs 12. One power line Vss is placed inside SRAM cell pair 12, and crosses a boundary section of SRAM cells 10-1 and 10-2, and is shared by SRAM cells 10-1 and 10-2. In addition to the Vdd lines and the Vss line, there are some other metal features such as metal lines "LI" including metal local connection lines LI-1, LI-2, LI-3, and LI-4, and some landing pads including WL-1 landing pads, BL-1 landing pads, BLB-1 landing pads, BLB-2 landing pads, BL-2 landing pads, and WL-2 landing pad, which are connected to the underlying contact plugs and vias via0. Local connection line LI-1 electrically interconnects the drain regions of the pull-down and pull-up transistors in SRAM cell 10-1, and local connection line LI-2 electrically interconnect the drain regions of the pull-down and pull-up transistors in SRAM cell 10-2.

The read port speed is significantly affected by the current Ion of transistors and the bit-line capacitance. Accordingly, as shown in FIG. 13, the read bit-line R-BL is placed in the lowest metal layer M1 to have minimized capacitance. The reason is that by placing the read bit-line R-BL in M1 layer, no metal landing pads are needed for connecting the read bit-line R-BL to the underlying transistors, and hence the corresponding capacitance introduced by the metal landing pads is saved. Furthermore, read bit-line R-BL is located at the boundary of SRAM cells 10-1 and 10-2, and is shared by SRAM cells 10-1 and 10-2, as is also shown in FIGS. 1 through 6.

In accordance with some embodiments, as shown in FIG. 13, power line Vss includes strip portion Vss-A, which has a uniform width, and a protrusion portion Vss-B joined to the strip portion Vss-A. The protrusion portion Vss-B is formed utilizing the space saved by spacing the metal features BL-1 landing pad apart from the BLB-1 landing pad. The formation of the protrusion portion Vss-B results in the reduced resistance of power line Vss also.

FIG. 14 illustrates the layout (and the top view of circuits on wafers/dies) of some metal features in metal layers M2, M3, and M4, and via layers via1, via2, and via3 in accordance with some embodiments. The elongated metal features in metal layers M2 and M4 have lengthwise directions in the X direction, and the elongated metal features in metal layer M3 have lengthwise directions in the Y direction. In metal layer M2, read word-lines R-WL are located. Throughout the description, the features followed by "10-1" are connected to (or parts of) SRAM cell 10-1, and the features followed by "10-2" are connected to (or parts of) SRAM cell 10-2.

Metal layer M3 includes power lines having lengthwise direction in the Y direction, and include power lines Vss and write bit-lines W-BL and W-BL-bar. Each of the SRAM cells 10-1 and 10-2 has a pair of write bit-lines W-BL and W-BL-bar, and share a common read bit-line R-BL (FIG. 13).

The cell write margin (write Vcc_min) of SRAM cells is dominated by cell setting (such as the ratio of the on-current W-PG-Ion to the on-current W-PU-Ion, and the higher the better) and write bit-line resistance. Accordingly, to reduce the resistance of the write bit-lines W-BL and W-BL-bar, the write bit-lines W-BL and W-BL-bar are moved to a higher metal layer M2 (rather than M1 layer), so that the write bit-lines W-BL and W-BL-bar may have lower resistance due to their greater thickness in the upper metal layer M2.

Metal layer M4 includes power lines having lengthwise direction in the X direction, and include two write word-lines W-BL, each connecting to one of SRAM cells 10-1 and 10-2. In addition, FIG. 14 also illustrates some landing pads, which are also marked with the metal layers in which they are located. For example, the landing pads W-WL-1 landing pad (M3) and W-WL-2 landing pad (M3) are the landing pads that are connected to write word-lines and are located in the M3 layer. The landing pads W-BL landing pad (M2) and W-BLB landing pad (M2) are the landing pads that are connected to write bit-lines and are located in the M2 layer.

Figures 15, 16:
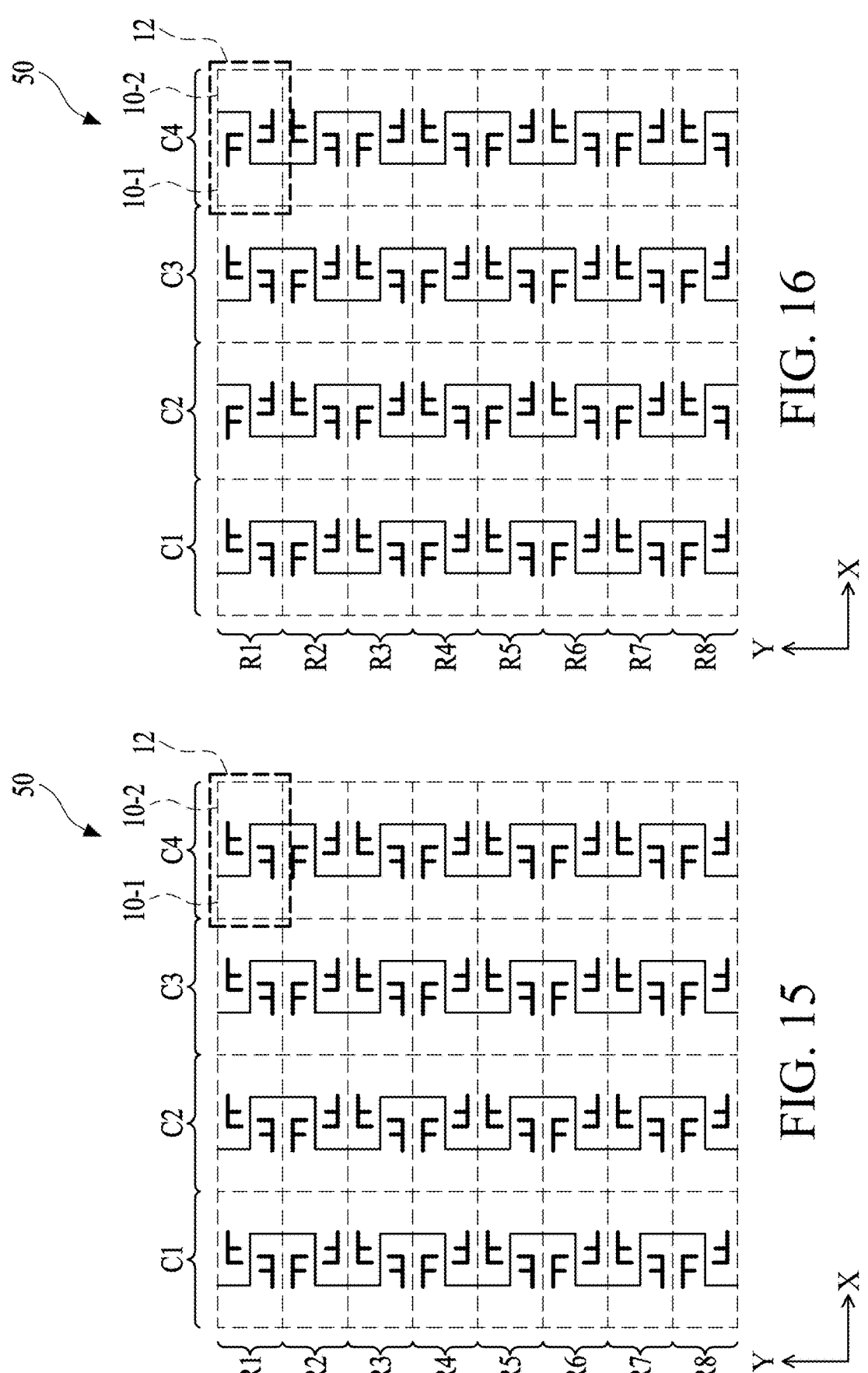
FIGS. 15 and 16 illustrate the mirroring schemes of SRAM cell arrays in accordance with some embodiments.

FIG. 15 illustrates a schematic layout of an SRAM cell array 50 in accordance with some embodiments. A plurality of SRAM cell pairs 12 are arranged as an array including a plurality of columns C1, C2, C3, and C4 and rows R1, R2, R3, R4, R5, R6, R7, and R8. Letter F is used to represent the relative directions of the layouts of SRAM cells 10-1 and 10-2. For example, the letter F of all SRAM cells 10-1 in the same row are all in the same direction, representing that the each of SRAM cell pair 12 has the same structure and the same direction (rather than flipped) as other SRAM cells 12 in the array. For any of the two abutted SRAM cell pairs 12 in the same row, the abutting of the neighboring SRAM cell pairs 12 is direct abutting and have the same orientation. Throughout the description, the term "direct abutting" indicates that each of the SRAM cell pairs 12 is the direct copy of any other SRAM cell 12 in the same row, without being flipped.

For any of the two abutted SRAM cell pairs 12 in the same column, however, the abutting is mirror abutting, with one SRAM cell pair 12 being flipped relative to its abutting SRAM cell pair 12, with the flipping being performed relative to a horizontal line. The mirror abutting of two neighboring SRAM cell pairs 12 also means that the abutting SRAM cell pairs 12 are symmetric relative to their joining boundary.

FIG. 16 illustrates a schematic layout of an SRAM cell array 50 in accordance with alternative embodiments. For any of the two abutted SRAM cell pairs 12 in the same column, the abutting of the neighboring SRAM cell pairs 12 (in the same column) is mirror abutting, so that the abutted SRAM cell pairs 12 have opposite orientations. In addition, for any of the two abutted SRAM cell pairs 12 in the same row, the abutting of the neighboring SRAM cell pairs is also mirror abutting, and the abutted SRAM cell pairs 12 have the opposite orientations.

In FIGS. 15 and 16, the boundaries between the SRAM cells 10-1 and 10-2 in a same SRAM cell pair 12 are illustrated. The boundaries between the SRAM cells 10-1 and 10-2 in a same column collectively are collected to form a non-straight pattern, which includes a plurality of offset vertical straight lines interconnected by horizontal lines.

Figure 17:
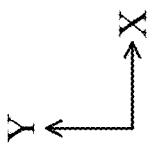
FIG. 17 illustrates the read bit-lines, write bit-lines, read word-lines, and write word-lines of an SRAM cell array in accordance with some embodiments.

FIG. 17 illustrates the layout of write bit-lines, read bit-lines, write word-lines, and read word-lines for a SRAM pair array 50 including two columns C1 and C2 and two rows R1 and R2 of SRAM cell pair 12. The write bit-lines extend in the Y direction and include metal lines W-BLB-1-1, W-BL-1-1, W-BLB-1-2, and W-BL-1-2, W-BL-2-1, W-BLB-2-1, W-BL-2-2, and W-BLB-2-2. The write bit-lines are electrically connected to column multiplexer and write driver, which are not shown. The read bit-lines extend in the Y direction and include R-BL-1 and R-BL-2. The read bit-lines are electrically connected to local sense amplifier (not shown). The write word-lines extend in the X direction and include W-WL-1, W-WL-2, W-WL-3, and W-WL-4. The read word-lines extend in the X direction and include R-WL-1, R-WL-2, R-WL-3, and R-WL-4. The word-lines are connected to a word-line driver and a selector, which are not shown. Each column has two write bit-line pairs for bit-line loading reduction (with each bit-line pair connected to a half of the bit cells in the column) and share one read bit-line R-BL (R-BL-1 or R-BL-2).

The embodiments of the present disclosure have some advantageous features. By forming non-rectangular SRAM cells and fitting the non-rectangular SRAM cell pair to occupy a rectangular chip area, the SRAM cells may occupy less chip area, with the active regions and metal lines in each SRAM cell pair occupying less chip area. The density of the SRAM cells is increased. The RC delay for both of bit-lines and word-lines is reduced, and the speed of the SRAM cells is increased.

In accordance with some embodiments of the present disclosure, a circuit comprises a two-port SRAM cell pair comprising a first two-port SRAM cell comprising a first pull-up transistor and a second pull-up transistor forming parts of a latch; a first pass-gate transistor and a second pass-gate transistor connecting to the first pull-up transistor and the second pull-up transistor, respectively; a first node-decoupling structure and a second node-decoupling structure connecting to drains of the first pull-up transistor and the second pull-up transistor, respectively; a first pair of write bit-lines configured to write into the first two-port SRAM cell; and a first part of a read bit-line parallel to, and on a side of, the first pair of write bit-lines; and a second two-port SRAM cell abutting the first two-port SRAM cell, wherein the second two-port SRAM cell comprises a second pair of write bit-lines; and a second part of the read bit-line parallel to, and on a side of, the second pair of write bit-lines.

In an embodiment, a middle line of the read bit-line passes through middle of each of the first part and the second part of the read bit-line. In an embodiment, each of the first two-port SRAM cell and the second two-port SRAM cell occupies an L-shaped chip area. In an embodiment, the first two-port SRAM cell and the second two-port SRAM cell fit to each other to occupy a rectangular chip area. In an embodiment, an inner boundary between the first two-port SRAM cell and the second two-port SRAM cell comprises a first section; and a second section and a third section connecting to opposite ends of the first section, wherein the second section and the third section are perpendicular to the first section.

In an embodiment, the first node-decoupling structure comprises an isolation transistor that is constantly turned off. In an embodiment, the first two-port SRAM cell is a 10-transistor SRAM cell. In an embodiment, the first node-decoupling structure comprises a dielectric gate, and a first semiconductor region and a second semiconductor region on opposing sides of the dielectric gate. In an embodiment, the first two-port SRAM cell is an 8-transistor SRAM cell. In an embodiment, the two-port SRAM cell pair comprises five elongated active regions, wherein first two of the elongated active regions are in the first two-port SRAM cell, the second two of the elongated active regions are in the second two-port SRAM cell, and wherein a fifth elongated active region is shared by the first two-port SRAM cell and the second two-port SRAM cell.

In an embodiment, the first two-port SRAM cell comprises a Vss node; and a read pull-down transistor and a read pass-gate transistor, wherein the read pull-down transistor is connected between the Vss node and the read pass-gate transistor, and the read pass-gate transistor is between the read pull-down transistor and the read bit-line. In an embodiment, the first two-port SRAM cell comprises a Vss node; and a read pull-down transistor and a read pass-gate transistor, wherein the read pull-down transistor is connected between the read bit-line and the read pass-gate transistor, and the read pass-gate transistor is between the read pull-down transistor and the Vss node.

In accordance with some embodiments of the present disclosure, a circuit comprises a Vdd node; and a two-port SRAM cell pair comprising a first SRAM cell and a second SRAM cell having a same structure, wherein the first SRAM cell is a ten-transistor SRAM cell comprising a first pull-up transistor and a second pull-up transistor; a first pull-down transistor and a second pull-down transistor forming a latch with the first pull-up transistor and the second pull-up transistor; a first pass-gate transistor and a second pass-gate transistor connecting to the latch; a p-type isolation transistor comprising a first source/drain region connecting to a drain region of the first pull-up transistor, and a gate connecting to the Vdd node; a read bit-line shared with the second SRAM cell; and a write bit-line pair connecting to gates of the first pass-gate transistor and the second pass-gate transistor.

In an embodiment, the p-type isolation transistor further comprises a second source/drain region connecting to an additional drain region of an additional pull-up transistor in a third SRAM cell. In an embodiment, the read bit-line is located in a bottommost metal layer (M1) of a respective die, and wherein the write bit-line pair is located in a M2 metal layer over the bottommost metal layer. In an embodiment, a first lengthwise direction of the read bit-line is parallel to a second lengthwise direction of the write bit-line pair. In an embodiment, the read bit-line comprises a first part in the first SRAM cell and a second part in the second SRAM cell, and wherein a first middle line of the first part and a second middle line of the second part are aligned to a same straight line.

In accordance with some embodiments of the present disclosure, a circuit comprises a Vdd node; and a two-port SRAM cell pair comprising a first SRAM cell and a second SRAM cell having a same structure, wherein the first SRAM cell is a ten-transistor SRAM cell comprising a first pull-up transistor and a second pull-up transistor; a first pull-down transistor and a second pull-down transistor forming a latch with the first pull-up transistor and the second pull-up transistor; a first pass-gate transistor and a second pass-gate transistor connecting to the latch; an node-decoupling structure comprising a gate structure; and a first semiconductor region and a second semiconductor region on opposing sides of the gate structure, wherein the first semiconductor region is connected to a drain region of the first pull-up transistor, and wherein the node-decoupling structure is configured to electrically decouple the first semiconductor region from the second semiconductor region; a read bit-line shared with the second SRAM cell; and a write bit-line pair connecting to the first pass-gate transistor and the second pass-gate transistor.

In an embodiment, the node-decoupling structure comprises an isolation transistor, and the isolation transistor comprises the gate structure as a gate, and the first semiconductor region and the second semiconductor region as source and drain regions, and wherein the isolation transistor is configured to be turned off constantly. In an embodiment, the gate structure comprises a dielectric gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a two-port Static Random-Access Memory (SRAM) cell pair comprising:
   a first two-port SRAM cell comprising:
   a first pull-up transistor and a second pull-up transistor forming parts of a latch;
   a first pass-gate transistor and a second pass-gate transistor connecting to the first pull-up transistor and the second pull-up transistor, respectively;
   a first node-decoupling structure and a second node-decoupling structure connecting to drains of the first pull-up transistor and the second pull-up transistor, respectively;

a first pair of write bit-lines configured to write into the first two-port SRAM cell; and a first part of a read bit-line parallel to, and on a side of, the first pair of write bit-lines; and a second two-port SRAM cell abutting the first two-port SRAM cell, wherein the second SRAM cell comprises:

a second pair of write bit-lines; and a second part of the read bit-line parallel to, and on a side of, the second pair of write bit-lines.

2. The circuit of claim 1, wherein a middle line of the read bit-line passes through middle of each of the first part and the second part of the read bit-line.

3. The circuit of claim 1, wherein each of the first two-port SRAM cell and the second two-port SRAM cell occupies an L-shaped chip area.

4. The circuit of claim 3, wherein the first two-port SRAM cell and the second two-port SRAM cell fit to each other to occupy a rectangular chip area.

5. The circuit of claim 3, wherein an inner boundary between the first two-port SRAM cell and the second two-port SRAM cell comprises:

a first section; and a second section and a third section connecting to opposite ends of the first section, wherein the second section and the third section are perpendicular to the first section.

6. The circuit of claim 1, wherein the first node-decoupling structure comprises an isolation transistor that is constantly turned off.

7. The circuit of claim 6, wherein the first two-port SRAM cell is a 10-transistor SRAM cell.

8. The circuit of claim 1, wherein the first node-decoupling structure comprises a dielectric gate, and a first semiconductor region and a second semiconductor region on opposing sides of the dielectric gate.

9. The circuit of claim 8, wherein the first two-port SRAM cell is an 8-transistor SRAM cell.

10. The circuit of claim 1, wherein the two-port SRAM cell pair comprises five elongated active regions, wherein first two of the elongated active regions are in the first two-port SRAM cell, the second two of the elongated active regions are in the second two-port SRAM cell, and wherein a fifth elongated active region is shared by the first two-port SRAM cell and the second two-port SRAM cell.

11. The circuit of claim 1, wherein the first two-port SRAM cell comprises:

a Vss node; and a read pull-down transistor and a read pass-gate transistor, wherein the read pull-down transistor is connected between the Vss node and the read pass-gate transistor, and the read pass-gate transistor is between the read pull-down transistor and the read bit-line.

12. The circuit of claim 1, wherein the first two-port SRAM cell comprises:

a Vss node; and a read pull-down transistor and a read pass-gate transistor, wherein the read pull-down transistor is connected between the read bit-line and the read pass-gate transistor, and the read pass-gate transistor is between the read pull-down transistor and the Vss node.

13. A circuit comprising:

a Vdd node; and a two-port Static Random-Access Memory (SRAM) cell pair comprising a first SRAM cell and a second SRAM cell having a same structure, wherein the first SRAM cell is a ten-transistor SRAM cell comprising:

a first pull-up transistor and a second pull-up transistor;

a first pull-down transistor and a second pull-down transistor forming a latch with the first pull-up transistor and the second pull-up transistor;

a first pass-gate transistor and a second pass-gate transistor connecting to the latch;

a p-type isolation transistor comprising a first source/drain region connecting to a drain region of the first pull-up transistor, and a gate connecting to the Vdd node;

a read bit-line shared with the second SRAM cell; and a write bit-line pair connecting to gates of the first pass-gate transistor and the second pass-gate transistor.

14. The circuit of claim 13, wherein the p-type isolation transistor further comprises a second source/drain region connecting to an additional drain region of an additional pull-up transistor in a third SRAM cell.

15. The circuit of claim 13, wherein the read bit-line is located in a bottommost metal layer (M1) of a respective die, and wherein the write bit-line pair is located in a M2 metal layer over the bottommost metal layer.

16. The circuit of claim 15, wherein a first lengthwise direction of the read bit-line is parallel to a second lengthwise direction of the write bit-line pair.

17. The circuit of claim 13, wherein the read bit-line comprises a first part in the first SRAM cell and a second part in the second SRAM cell, and wherein a first middle line of the first part and a second middle line of the second part are aligned to a same straight line.

18. A circuit comprising:

a Vdd node; and a two-port Static Random-Access Memory (SRAM) cell pair comprising a first SRAM cell and a second SRAM cell having a same structure, wherein the first SRAM cell is a ten-transistor SRAM cell comprising:

a first pull-up transistor and a second pull-up transistor;

a first pull-down transistor and a second pull-down transistor forming a latch with the first pull-up transistor and the second pull-up transistor;

a first pass-gate transistor and a second pass-gate transistor connecting to the latch;

a node-decoupling structure comprising:

a gate structure; and a first semiconductor region and a second semiconductor region on opposing sides of the gate structure, wherein the first semiconductor region is connected to a drain region of the first pull-up transistor, and wherein the node-decoupling structure is configured to electrically decouple the first semiconductor region from the second semiconductor region;

a read bit-line shared with the second SRAM cell; and a write bit-line pair connecting to the first pass-gate transistor and the second pass-gate transistor.

19. The circuit of claim 18, wherein the node-decoupling structure comprises an isolation transistor, and the isolation transistor comprises the gate structure as a gate, and the first semiconductor region and the second semiconductor region as source and drain regions, and wherein the isolation transistor is configured to be turned off constantly.

20. The circuit of claim 18, wherein the gate structure comprises a dielectric gate.

* * * * *